(12) United States Patent
Lai

(10) Patent No.: US 7,580,452 B2
(45) Date of Patent: Aug. 25, 2009

(54) DYNAMIC COMPARATOR SYSTEM

(75) Inventor: Benny Wing Hung Lai, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 625 days.

(21) Appl. No.: 11/281,311

(22) Filed: Nov. 17, 2005

(65) Prior Publication Data

US 2007/0109163 A1    May 17, 2007

(51) Int. Cl.
*H03K 5/159* (2006.01)
(52) U.S. Cl. .................. 375/232; 375/229; 375/230; 375/233
(58) Field of Classification Search ........... 375/229, 375/232, 233
See application file for complete search history.

(56) References Cited

U.S. PATENT DOCUMENTS

| | | | | |
|---|---|---|---|---|
| 4,467,291 A * | 8/1984 | Roza | ............................ | 341/143 |
| 4,814,642 A * | 3/1989 | Kleks | ............................ | 327/80 |
| 4,870,657 A * | 9/1989 | Bergmans et al. | ........... | 375/233 |
| 5,107,379 A * | 4/1992 | Huber | ............................ | 360/46 |
| 5,774,505 A * | 6/1998 | Baugh | ............................ | 375/348 |
| 5,822,143 A | 10/1998 | Cloke et al. | | |
| 6,604,221 B1 * | 8/2003 | Ueno | ............................ | 714/771 |
| 6,813,219 B1 | 11/2004 | Blackmon | | |
| 6,870,881 B1 | 3/2005 | He | | |
| 6,940,898 B2 | 9/2005 | Shanbhag et al. | | |
| 6,952,444 B1 | 10/2005 | Segal et al. | | |
| 6,999,018 B2 * | 2/2006 | Aeby et al. | ............... | 341/155 |
| 2003/0086516 A1 * | 5/2003 | Wagner | ....................... | 375/350 |
| 2003/0090299 A1 * | 5/2003 | Dathe et al. | .................. | 327/77 |

\* cited by examiner

*Primary Examiner*—Chieh M Fan
*Assistant Examiner*—Siu M Lee (57) ABSTRACT

A dynamic comparator system includes a dynamic comparator, a feedback filter, and a summer. The dynamic comparator is configured with a comparison signal having an initial state. The dynamic comparator is further configured to receive an input signal and to generate an output signal. The feedback filter is configured to receive the output signal from the dynamic comparator and to generate a filter response signal therefrom. The summer is configured to receive the filter response signal from the feedback filter, to receive the input signal, and to generate a sum signal combining the filter response signal and the input signal. The dynamic comparator compares the input signal to the initial state of the comparison signal, and based on the comparison, optionally adjusts the state of the comparison signal.

15 Claims, 6 Drawing Sheets

DYNAMIC COMPARATOR SYSTEM

BACKGROUND

In modern digital communication systems, data bits are transmitted through a medium, such as back planes and cables. For non-return to zero (NRZ) data systems, the step response times of these media determine how tightly packed, and in turn, how fast, these bits can be transmitted. Since a bit sequence consists of a linear combination of steps, separated in time, the settling time of these steps determine how closely in time they can be spaced.

As these steps are spaced closer and closer together in time, each step is not allowed enough time to settle to its normal high or low signal level before the next step is transmitted. Thus, the bit signaling interferes with each other bit and the resulting waveform is often jumbled with no clear high or low signal. This effect is known as inter-symbol interference (ISI). ISI adversely affects the transmission rate of data in communication systems.

For these and other reasons, a need exists for the present invention.

SUMMARY

One aspect of the present invention provides a dynamic comparator system including a dynamic comparator, a feedback filter, and a summer. The dynamic comparator is configured with a comparison signal having an initial state. The dynamic comparator is further configured to receive an input signal and to generate an output signal. The feedback filter is configured to receive the output signal from the dynamic comparator and to generate a filter response signal therefrom. The summer is configured to receive the filter response signal from the feedback filter, to receive the input signal, and to generate a sum signal combining the filter response signal and the input signal. The dynamic comparator compares the input signal to the initial state of the comparison signal, and based on the comparison, optionally adjusts the state of the comparison signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAIL DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Various methods have been used in an attempt to overcome the ISI effect caused in transmitting data bits in digital communication systems. Such effect causes signals to degrade, resulting in a very slow rise time. Some techniques for overcoming these effects include signal boosting at a transmitter (pre-emphasis), as well as signal equalization at a receiver. One type of signal equalization is known as decision-feedback equalization (DFE). DFE systems are configured to eliminate all of the slow signal response or the slow transition time, and add back signal boost restore the signal back to the maximum level.

Figure 1:
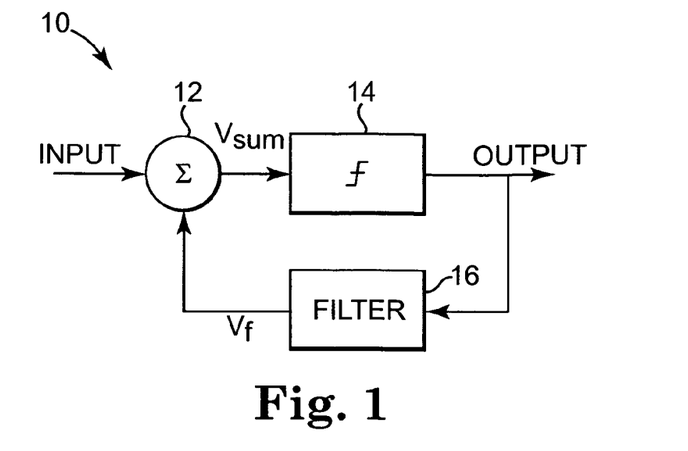
FIG. 1 illustrates a block diagram of a DFE system.

A block diagram of a DFE system 10 is illustrated in FIG. 1. DFE system 10 includes linear summer 12, data comparator 14, and feedback filter 16. An input signal is fed into linear summer 12 and an output signal is output from data comparator 14.

Figure 2A:
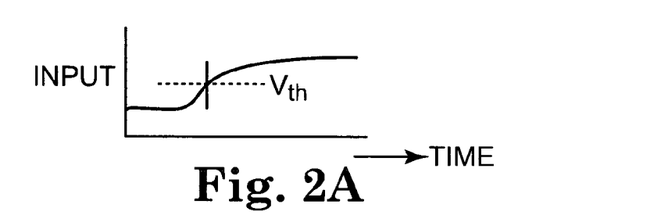
FIGS. 2A-2D illustrate signals for the DFE system in accordance with FIG. 1.
Figure 2B:
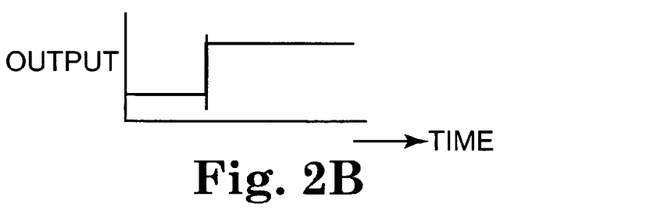

The operation of DFE system 10 is illustrated with references to the signals illustrated in FIG. 2A-2D. First, a slow step response, for example, from a backplane, is fed into DFE system 10 as the input signal. Such an input signal is illustrated in FIG. 2A. As illustrated, the rise time of the input signal illustrated in FIG. 2A is relative slow. As such, it takes significant time for the signal to settle and reach its steady state. In this way, the distance between adjacent bits must be lengthened when such a significant amount of time is required for the signal to reach its steady state. As a comparison, FIG. 2B illustrates an ideal output step signal. As evident, the ideal signal reaches its maximum instantaneously, rather than the slow response of the input signal.

In order to more quickly identify the state of the input signal, data comparator 14 is configured to have a fixed threshold voltage $V_{th}$, against which the input signal can be compared. In one case, the threshold voltage $V_{th}$ is one half the magnitude of the maximum value of the input signal. In this way, once a signal reaches the level $V_{th}$ it is determined to be high or a 1. The threshold voltage $V_{th}$ is illustrated in FIG. 2A. Then, from this information a response can be generated and added back to the input to more closely approximate a step signal.

Figure 2C:
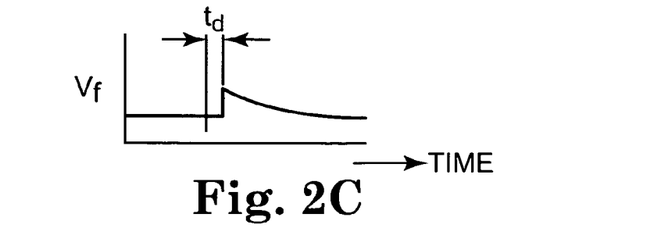

Generating a response to be added back to the input is accomplished with feedback filter 16. Feedback filter 16 received the output signal from data comparator 14, which is representative of the threshold voltage $V_{th}$. Feedback filter 16 then produces a filter voltage $V_f$. FIG. 2C illustrates the filter voltage $V_f$ generated by the feedback filter 16. This output voltage $V_f$ is then added back to the original input signal in order to produce a signal $V_{sum}$, illustrated in FIG. 2D, which has settled to a voltage level that remains constant over time. As illustrated in FIG. 2C, the peak in the filter voltage $V_f$ coincides in time with the input signal crossing the threshold voltage $V_{th}$. In this way, this peak is delayed in time $t_d$ after the end of the first bit is reached.

Figure 2D:
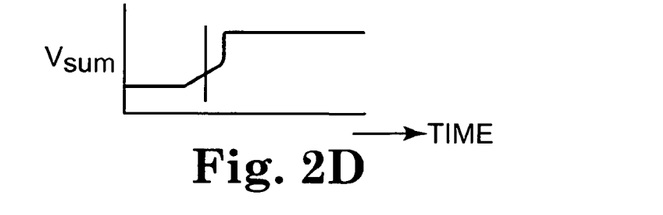

The filter voltage $V_f$ and the input signal are summed together at summer 12 in order to produce the summed voltage $V_{sum}$. The output voltage $V_{sum}$ is illustrated in FIG. 2D. In this way, this decision-feedback equalization system 10 produces a $V_{sum}$ signal that enables the slow-rising input signal to reach a steady-state level quickly. In this example, the full amplitude of the input is restored.

Although the input signal is largely recovered, in order to produce stability in the system, a delay in the overall loop response is introduced. As indicated in FIG. 2C, a significant delay of time $t_d$, is inserted into the filter response to ensure that the output of the filter does not impact the slicing decision that is currently being made by data comparator 14. In one case, the time delay $t_d$ equals one-bit time. Inserting a one-bit delay prevents the system from being able to make any decision on the present bit until the end of the bit. So the delay time added into the system actually limits how well the system can recover the step input signal. In this way, such a system does not correct for the ISI distortion until after one bit time in order to fully guarantee stability of the system. In some instances, the data rate is compromised because of this delay.

Figure 3:
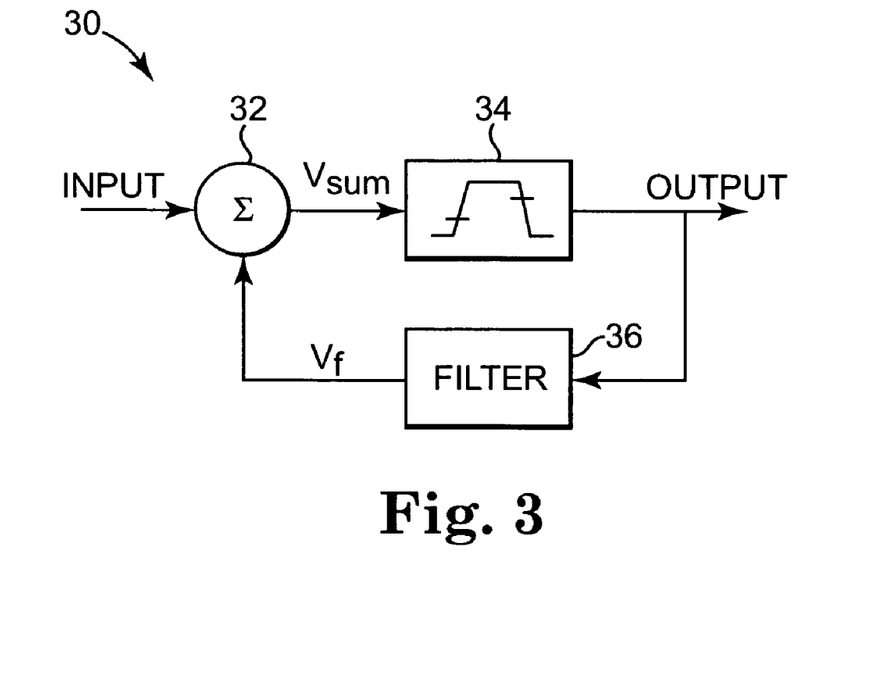
FIG. 3 illustrates a block diagram of a DFE system in accordance with one embodiment of the present invention.

FIG. 3 illustrates dynamic comparator system 30 in accordance with one embodiment of the present invention. Dynamic comparator system 30 includes summer 32, dynamic comparator 34 and filter 36. The operation of dynamic comparator system 30 is similar to DFE system 10 above. In dynamic comparator system 30, however, dynamic comparator 34 replaces the fixed threshold comparator illustrated in DFE system 10. No time delay is introduced in dynamic comparator system 30 such that faster data rates are achievable over those in a DFE system 10.

In operation of dynamic comparator system 30, a slow step response is fed into dynamic comparator system 30 as the input signal. Such an input signal is, for example, from a backplane that causes loss in the signal. As such, it takes significant time for the input signal to settle and reach its steady state (either high or low).

In order to more quickly identify the state of the input signal, dynamic comparator 34 is configured to have a dynamic slicing threshold, that is, the threshold voltage against which the input signal can be compared is changeable. Initially, dynamic comparator 34 is configured with in initial threshold voltage that is advanced from the nominal midpoint level used for the threshold level $V_{th}$ in DFE system 10. In this way, the comparison is triggered sooner in time thereby reducing pre-curser distortion. A correction signal is then quickly added to the input to create a steady state signal, and in one example, a full-amplitude signal.

Figure 4:
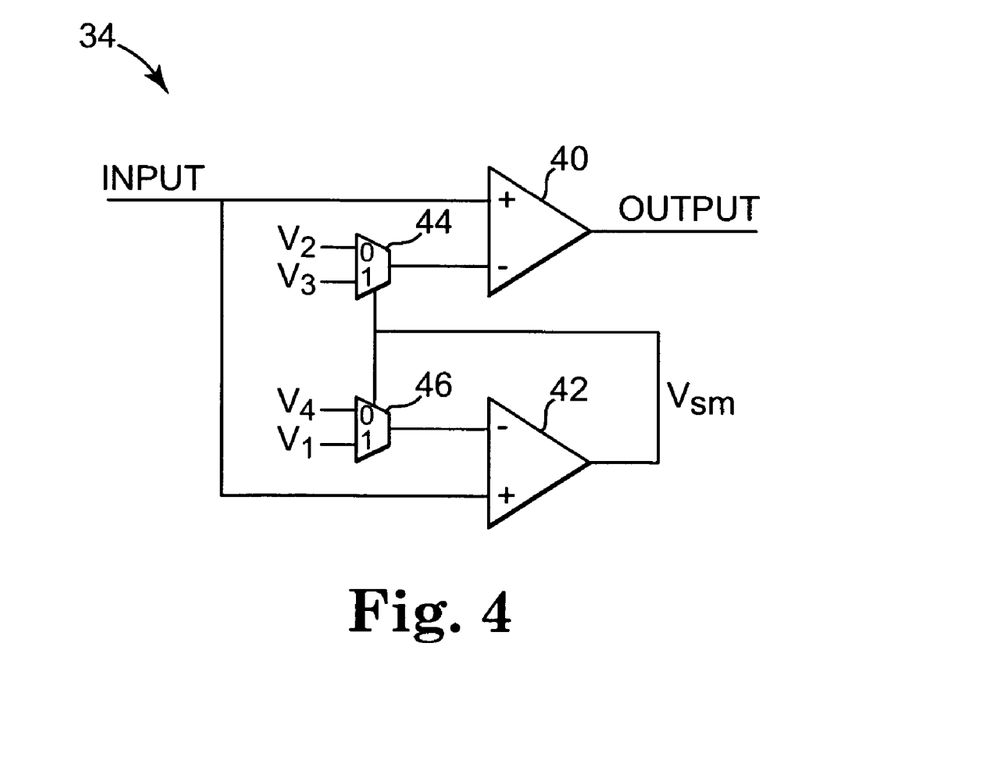
FIG. 4 illustrates a block diagram of a dynamic comparator from the DFE system illustrated in FIG. 3 in accordance with one embodiment of the present invention.

In one embodiment, dynamic comparator 34 includes main comparator 40, secondary comparator 42, first analog selector 44, and second analog selector 46. As illustrated in FIG. 4, dynamic comparator 34, and input signal is received at the positive terminal of main comparator 40 and the positive terminal of secondary comparator 42. The output of first analog selector 44 is received by the negative terminal of main comparator 40. The output of second analog selector 46 is received by the negative terminal of secondary comparator 42. The output of secondary comparator 42 is received by, and controls analog selection within, analog selectors 44 and 46. Main comparator 40 produces an output signal, which is feed to filter 36.

Figure 5:
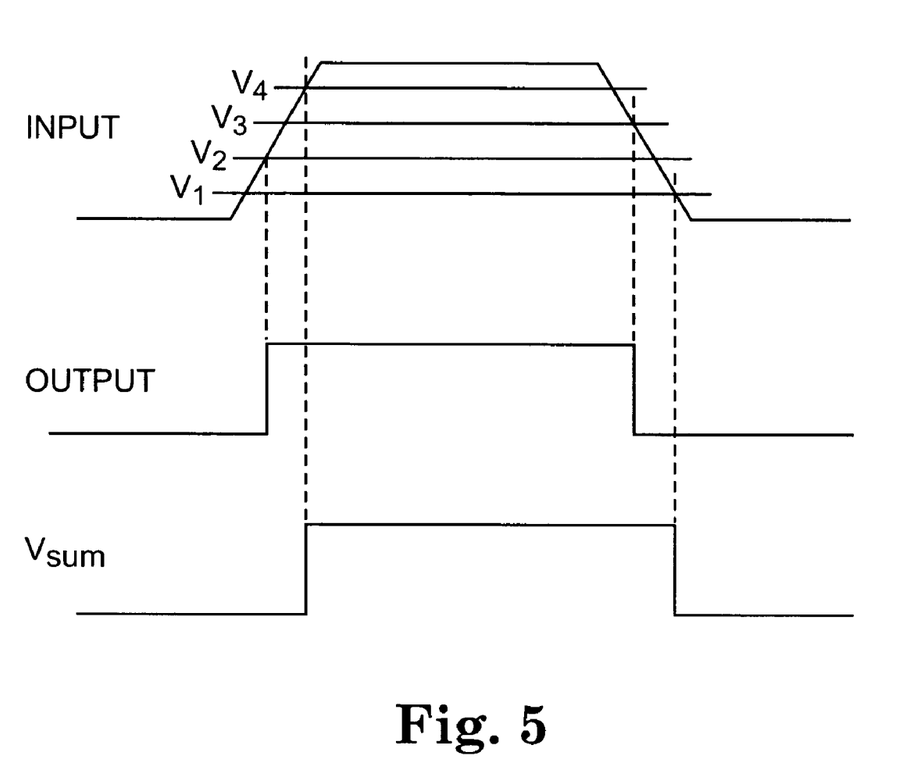
FIG. 5 illustrates a voltage transfer function for the dynamic comparator illustrated in FIG. 4.

The voltage transfer function for one embodiment of dynamic comparator system 30 is illustrated in FIG. 5. As illustrated, initially, with the input low, the trigger level of main comparator 40 is set to $V_2$. In one case, $V_2$ represents a lower level than the fixed level $V_{th}$ used in system 10. Then, as the input level exceeds $V_2$, the output changes to a logic high state. When the input exceeds $V_4$, the secondary comparator 42 is triggered, and its output $V_{sm}$ changes the thresholds of the main comparator 40 and the secondary comparator 42 to $V_3$ and $V_1$, respectively. In this way, the threshold level is adjusted upward in such a way that the slicing level is actually dependant on the level of the input signal. In the illustration of FIG. 5, it is assumed that the input level is going up, but the same process is repeated in symmetrical order for a negatively going input.

In either case, secondary comparator 42 of dynamic comparator 34 performs the functions of signal detection and appropriate adjustment of the thresholds of both the main comparator 40 and of itself. Secondary comparator 42 and analog switch 46 effectively form a Schmitt trigger.

Figure 6:
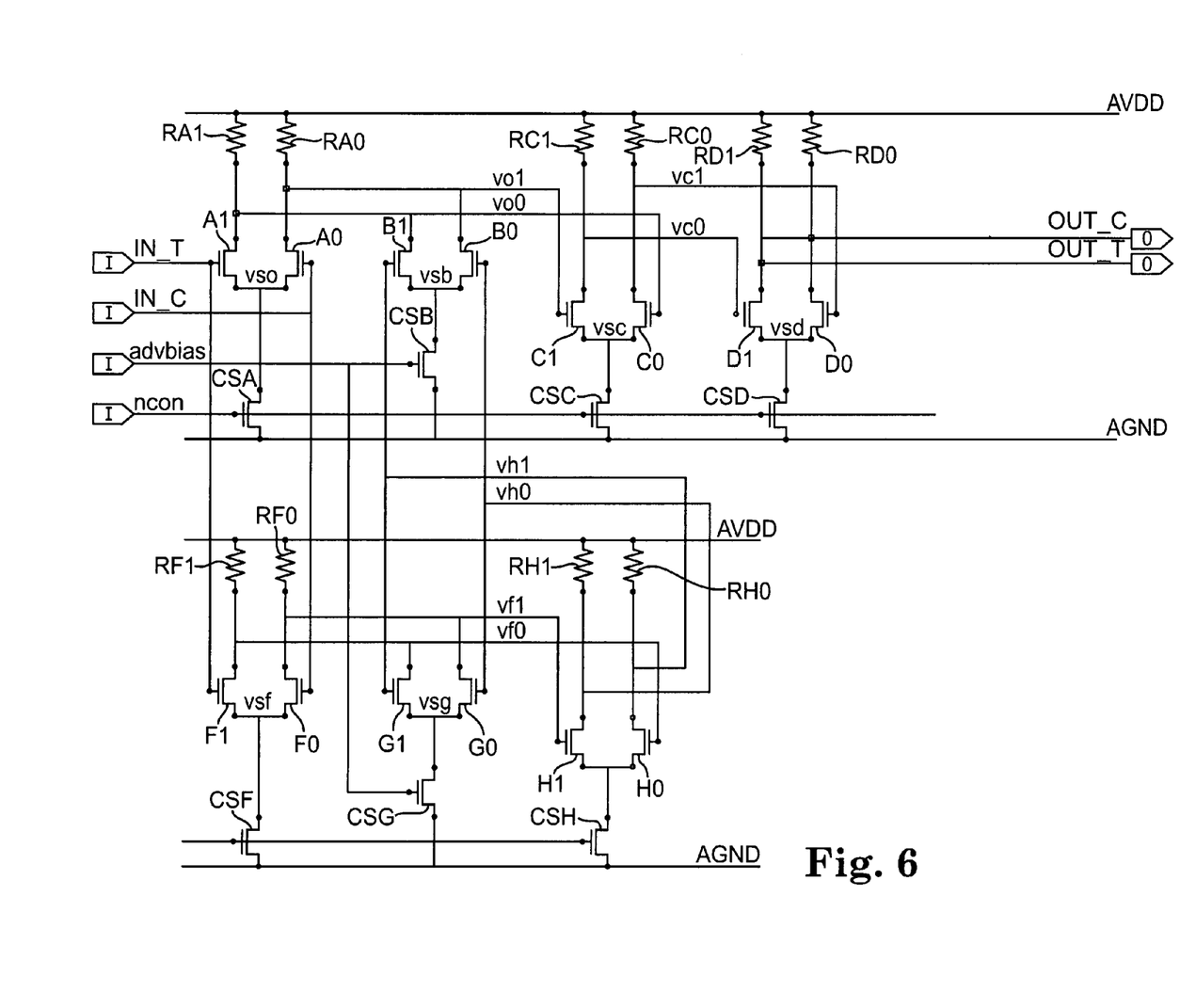
FIG. 6 illustrates a DFE system in accordance with one embodiment of the present invention.

FIG. 6 illustrates an alternative embodiment of a dynamic comparator in accordance with one embodiment of the present invention. A main comparator includes differential transistor pair A1 and A0, buffer transistor pairs C1 and C0 and D1 and D0, along with their associated load resistors RA1 and RA0, RC1 and RC0, and RD1 and RD0, and associated current sources CSA, CSC, and CSD. A current summing differential transistor pair B1 and B0 select the trigger threshold of the main comparator. A second comparator includes differential transistor pairs F1 and F0 and H1 and H0, along with their load resistors RF1 and RF0 and RH1 and RH0 and current sources CSF and CSH. The threshold voltage of this second comparator is selected by differential transistor pair G1 and G0. The differential outputs of the secondary comparator, vh 1 and vh0 drive the inputs of the threshold adjusting differential pairs B1 and B0, and G1 and G0.

The input and output signals are differential. The differential input signals are IN_T and IN_C. The differential output signals are OUT_T and OUT_C. The current sources of the comparators are biased with the signal NCON, which is set to give a proper voltage swing. The current sources of the threshold selecting differential pairs B1 and B0 and G1 and G0 are variably controlled externally by the signal ADVBIAS. Source voltage is given by AVDD and ground is AGND.

Dynamic comparator system 30 using the dynamic comparator in accordance with the illustration of FIG. 6 as dynamic comparator 34 operates essentially as described above in relation to the use of dynamic comparator 34 illustrated in FIG. 4 in dynamic comparator system 30. In the embodiment of FIG. 6, however, the dynamic comparator is implemented in CMOS technology using current mode logic (CML) configuration. CML is a logic family where the current of a differential pair is steered to represent the two binary states of 1 and 0. The currents flowing across load resistors create the differential output voltage signals. The differential pair consists of switching elements such as bipolar or FET transistors.

In the FIG. 6 illustration, the dynamic comparator is switching current rather that switching voltage, but in either case an initial threshold signal is used in the dynamic comparator that can be adjusted. In this way, the comparison is triggered sooner in time than with fixed-threshold systems, thereby reducing pre-curser distortion. A correction signal is quickly added to the input to create steady-state signal, and in one example, a full-amplitude signal.

Figure 7:
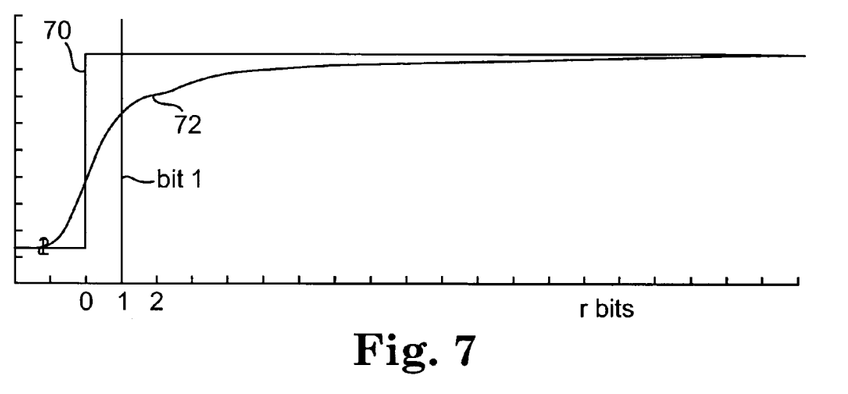
FIG. 7 illustrates an ideal step signal and an input signal for a DFE system in accordance with one embodiment of the present invention.

FIG. 7 illustrates an exemplary actual input signal 72, which is input to dynamic comparator system 30 using either a dynamic comparator as illustrated in FIG. 3, or a dynamic comparator as illustrated in FIG. 6 in accordance with embodiments of the present invention. Also illustrated for comparison, is an ideal step input signal 70. As is evident from the illustration, actual input signal 72 is degraded over time relative to ideal signal 70 due to, for example, a lossy backplane. In this way, it takes a relatively long time for the magnitude (illustrated in the vertical direction) of the signal 72 to return to the magnitude of the ideal step signal 70.

In one embodiment, the markings on the horizontal axis delineate the number of bits. In one case, the system is timed at six and a quarter gigabits, and the end of the first bit is labeled with a vertical line. As is evident in the illustration, ideal step input signal 70 recovers to its maximum level before the end of the first bit. As is further evident in the illustration, actual input signal 72 is degraded, and does not reach a steady-state or its maximum until well after the end of the first bit. In one embodiment, dynamic comparator system 30, using either the dynamic comparator illustrated in FIG. 3 or the dynamic comparator illustrated in FIG. 6, is configured to recover the input signal back to a steady-state before the end of the first bit.

Regeneration of the slow-rising input signal to a steady-state level quickly allows for steps in a random bit sequence to be more closely packed without interfering with each other. This is true even where the input signal is not brought back to its maximum level, but is brought to a steady-state. For example, if the slow-rising input signal is only recovered to 0.8 of this maximum level before the first bit, and remains steady there after, the subsequent steps will not be interfered with this step, despite that the full amplitude has not been restored.

In one embodiment, however, dynamic comparator system 30 is configured to recover the input signal back to the maximum level before the end of the first bit. In some such full recovery signal systems, the full-amplitude is more tolerate to noise.

Figure 8:
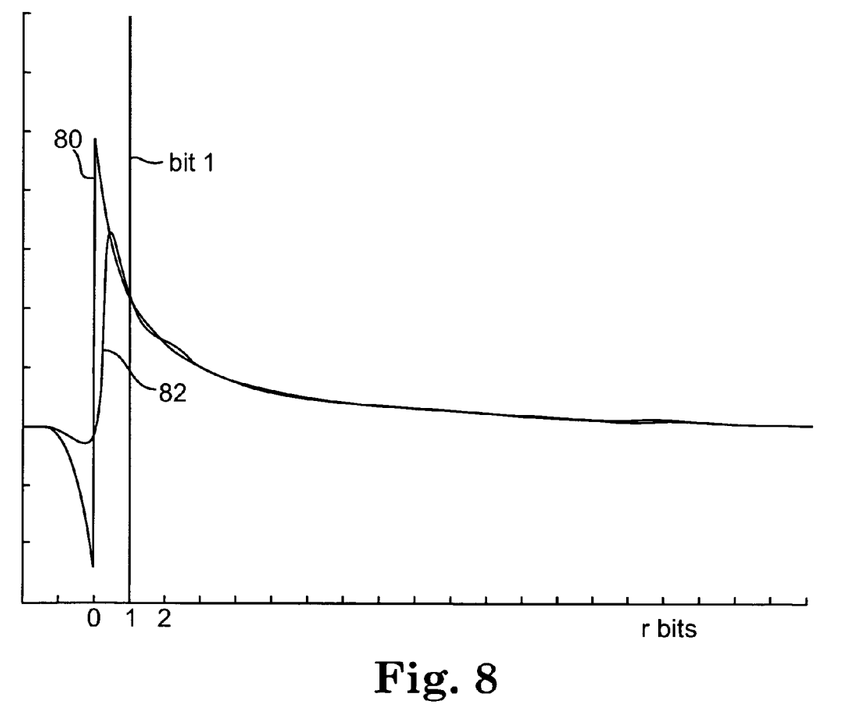
FIG. 8 illustrates signal responses of a filter for an ideal step input and for an actual input in accordance with one embodiment of the present invention.

FIG. 8 illustrates a signal response 82 of a filter 36 for an actual input signal in accordance with one embodiment of the present invention. Also illustrated for comparison is a desired response 80 for an ideal filter, which when added to the input signal 72, yields the ideal step of the signal 70. The actual signal response 82 is for filter 36 in dynamic comparator system 30 using a dynamic comparator as illustrated in FIG. 3 or using a dynamic comparator as illustrated in FIG. 6. The ideal signal response 80 is illustrated to indicate the target for the actual signal generated by filter 36. Actual signal response 82 is the actual waveform that is generated from filter 36. As illustrated, the actual signal response 82 matches closely with the target signal 80. In one embodiment, filter 36 is a composite filter consisting of three high pass filters. The signal response 82 from filter 36 is fed back into summer 32.

Figure 9:
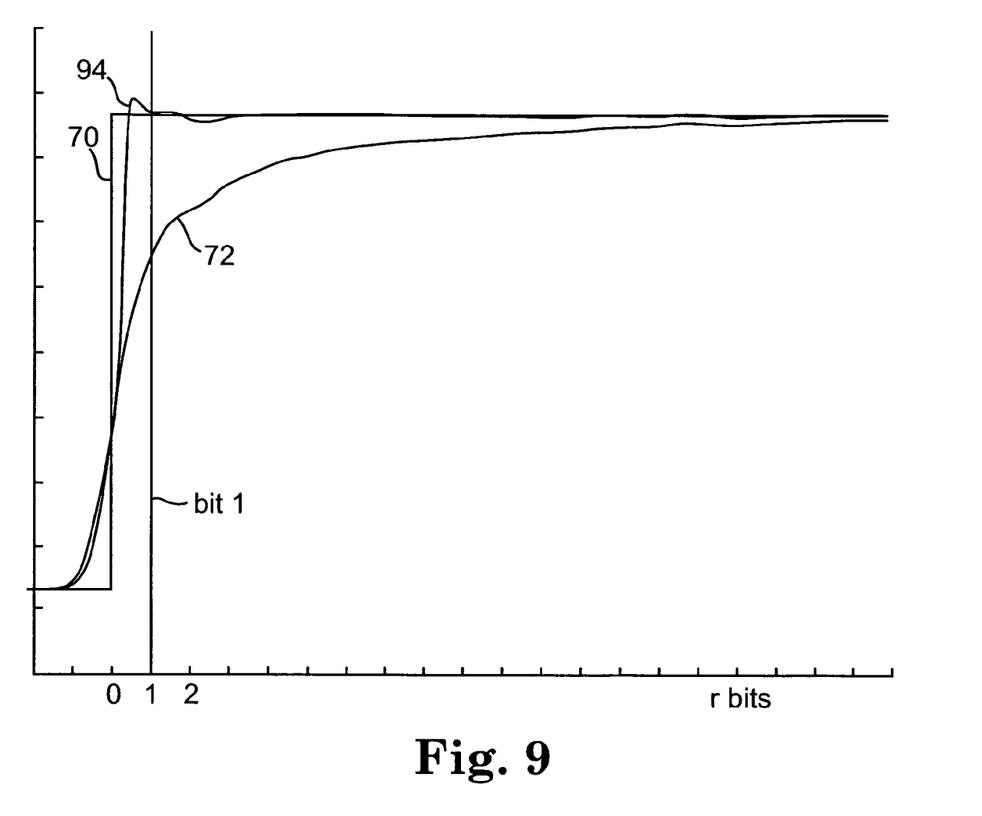
FIG. 9 illustrates a summing signal for an ideal step, and an actual result, as well as an input signal for a DFE system.

FIG. 9 illustrates an actual summing signal 94 from summer 32 of dynamic comparator system 30 in accordance with one embodiment of the present invention. Also illustrated for comparison is an ideal step signal 70 for a summing signal, as is an actual input signal 72. As illustrated, in one embodiment summing signal 94 substantially completely recovers the step signal. Furthermore, the summing signal is able to recover the magnitude of the step signal well in advance of the end of the first bit. In this way, dynamic comparator system 30, using dynamic comparator 34, which is an intelligent slicer, does not need to wait one bit later before it makes a decision on signal state. That decision is actually made within one bit. Any triggering and adjustment that is done all occurs during the bit time, and the signal is added straight back during the bit time as well. Consequently, at the end of the first bit, the signal is already fully recovered to the maximum, and the system is ready for the next falling edge.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A dynamic comparator system comprising:
 a first comparator comprising:
  a first input terminal configured to receive an input signal having amplitude level transitions representing data bit values;
  a second input terminal configured to receive a first threshold reference voltage $V_2$ at a first instant in time during a rising edge transition of said input signal;
  an output terminal that provides a comparator output signal having a rising edge transition in response to said input signal exceeding said first threshold reference voltage $V_2$; and
 a second comparator configured as a threshold reference voltage switch controller, said second comparator comprising:
  a first input terminal configured to receive said input signal;
  a second input terminal configured to receive a second threshold reference voltage $V_4$ that is higher in amplitude than said first threshold reference voltage $V_2$; and
  an output terminal that provides a switching control signal having an amplitude level transition in response to said input signal exceeding said second threshold reference voltage $V_4$, said switching control signal used thereon to dynamically replace said first threshold reference voltage $V_2$ that is coupled into said second input terminal of said first comparator, with a third threshold reference voltage $V_3$ greater than said first threshold reference voltage $V_2$, thereby reconfiguring said first comparator to operate upon a pre-distorted input signal provided thereafter at said first input terminal of said first comparator, for settling said comparator output signal into a steady state condition within a time delay corresponding to one data bit of said input signal.

2. The dynamic comparator system of claim 1, further comprising:
 a filter coupled to said first comparator and configured to receive said comparator output signal and generate therefrom, a filtered signal; and
 a summer coupled to said filter, the summer configured to provide pre-distortion upon said input signal by summing said filtered signal with said input signal, the summer further configured to couple the pre-distorted input signal into said first input terminals of said first and second comparators.

3. The dynamic comparator system of claim 2, wherein said filter is a high pass filter.

4. The dynamic comparator system of claim 1, wherein said switching control signal provided from the output terminal of said second comparator is used to dynamically replace said second threshold reference voltage $V_4$ that is coupled into said second input terminal of said second comparator, with a fourth threshold reference voltage $V_1$ having an amplitude less than that of said second threshold reference voltage $V_4$.

5. The dynamic comparator system of claim 4, further comprising:
a first analog selector configured to receive said switching control signal from the output terminal of said second comparator and in response thereto, route one of said first threshold reference voltage $V_2$ or said third threshold reference voltage $V_3$ into the second input terminal of said first comparator; and
a second analog selector configured to receive said switching control signal from the output terminal of said second comparator and in response thereto, route one of said second threshold reference voltage $V_4$ or said fourth threshold reference voltage $V_1$ into the second input terminal of said second comparator.

6. The dynamic comparator system of claim 1, wherein the first input terminals of said first and second comparators are positive input terminals, and wherein the second input terminals of said first and second comparators are negative input terminals.

7. The dynamic comparator system of claim 1, wherein the steady state condition of said comparator output signal corresponds to an amplitude level that is less than a maximum output level amplitude swing of said first comparator.

8. The dynamic comparator system of claim 1, wherein the steady state condition of said comparator output signal corresponds to a maximum output level amplitude swing of said first comparator.

9. The dynamic comparator system of claim 1, wherein said first threshold reference voltage $V_2$ is selected to have an amplitude level lower than a mid-level amplitude of said rising edge transition of said input signal.

10. The dynamic comparator system of claim 9, wherein said third threshold reference voltage $V_3$ is selected to have an amplitude level higher than said mid-level amplitude.

11. A method for providing signal equalization upon an input signal having amplitude level transitions representing data bit values, the method comprising:

generating an output signal level transition by comparing said input signal against a first threshold reference voltage $V_2$ at a first instant of time during a rising edge of said input signal;
propagating said output signal level transition though a high pass filter;
summing the filtered signal propagated out of said high pass filter with said input signal in order to produce a pre-distorted input signal;
replacing said first threshold reference voltage $V_2$ with a second threshold reference voltage $V_3$ at a second instant of time; and
comparing said pre-distorted input signal against said second threshold reference voltage $V_3$ during a falling edge transition of said pre-distorted input signal thereby providing equalization upon said input signal by achieving a steady-state amplitude within a time delay corresponding to one data bit of said input signal.

12. The method of claim 11, wherein said first threshold reference voltage $V_2$ is selected to have an amplitude level lower than a mid-level amplitude of said rising edge of said input signal.

13. The method of claim 12, wherein replacing said first threshold reference voltage $V_2$ with said second threshold reference voltage $V_3$ at said second instant of time comprises:
generating a switching control signal by comparing said input signal against a third threshold reference voltage $V_4$; and
using the switching control signal to operate a first switch whereby said first threshold reference voltage $V_2$ is replaced by said second threshold reference voltage $V_3$ at said second instant of time.

14. The method of claim 13, further comprising:
replacing said third threshold reference voltage $V_4$ with a fourth threshold reference voltage $V_1$ at said second instant of time; and
comparing said pre-distorted input signal against said fourth threshold reference voltage $V_1$ during said falling edge transition of said pre-distorted input signal.

15. The method of claim 14, wherein replacing said third threshold reference voltage $V_4$ with said fourth threshold reference voltage $V_1$ at said second instant of time comprises:
using said switching control signal to operate a second switch whereby said third threshold reference voltage $V_4$ is replaced with said fourth threshold reference voltage $V_1$ at said second instant of time.

* * * * *

UNITED STATES PATENT AND TRADEMARK OFFICE
CERTIFICATE OF CORRECTION

PATENT NO. : 7,580,452 B2
APPLICATION NO. : 11/281311
DATED : August 25, 2009
INVENTOR(S) : Benny Wing Hung Lai It is certified that error appears in the above-identified patent and that said Letters Patent is hereby corrected as shown below:

Column 8, Line 5, Claim 11, delete "though" and insert --through--.

Signed and Sealed this
Twenty-fifth Day of September, 2012

David J. Kappos
*Director of the United States Patent and Trademark Office*